United States Patent
Stemmer

(10) Patent No.: US 9,581,667 B2
(45) Date of Patent: Feb. 28, 2017

(54) METHOD AND MAGNETIC RESONANCE SYSTEM TO IMPLEMENT A MULTI-ECHO MEASUREMENT SEQUENCE

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 503 days.

(21) Appl. No.: 14/245,294

(22) Filed: Apr. 4, 2014

(65) Prior Publication Data

US 2014/0300356 A1 Oct. 9, 2014

(30) Foreign Application Priority Data

Apr. 5, 2013 (DE) .......................... 10 2013 206 026

(51) Int. Cl.
*G01R 33/50* (2006.01)
*G01R 33/561* (2006.01)

(52) U.S. Cl.
CPC .......... *G01R 33/50* (2013.01); *G01R 33/5616* (2013.01)

(58) Field of Classification Search
CPC .. G01R 33/50; G01R 33/543; G01R 33/5616; G01R 33/5615; G01R 33/561
USPC ............... 324/307, 309, 313, 318, 319, 322; 600/410
See application file for complete search history.

(56) References Cited

U.S. PATENT DOCUMENTS

| 5,917,323 | A | * | 6/1999 | Du ................... G01R 33/56581 324/306 |
| 6,222,365 | B1 | | 4/2001 | Taniguchi et al. |
| 7,535,222 | B2 | | 5/2009 | Bammer et al. |
| 7,840,049 | B2 | | 11/2010 | Stemmer |
| 2002/0135366 | A1 | | 9/2002 | Heubes |
| 2004/0015071 | A1 | | 1/2004 | Komura et al. |
| 2009/0169084 | A1 | | 7/2009 | Li et al. |
| 2009/0177078 | A1 | | 7/2009 | Takizawa et al. |
| 2012/0013336 | A1 | | 1/2012 | Hetzer et al. |
| 2012/0235684 | A1 | | 9/2012 | Stemmer |

OTHER PUBLICATIONS

Huo et al., "Parallel Imaging Method for Split-Blade PROPELLER DWI," Proc. Intl. Soc. Mag. Reson. Med., vol. 16, p. 756 (2008).
Robson et al., "Diffusion-Weighted Multiple Shot Echo Planar Imaging of Humans without Navigation," Magnetic Resonance in Medicine, vol. 38, pp. 82-88 (1997).
Yu et al., "A Multi-echo Acquisition Method with Reduced Echo Spacing for Robust IDEAL Water-Fat Decomposition at 3T," Proc. Intl. Soc. Mag. Reson. Med., vol. 15, p. 3353 (2007).

(Continued)

*Primary Examiner* — Melissa Koval
*Assistant Examiner* — Rishi Patel
(74) *Attorney, Agent, or Firm* — Schiff Hardin LLP

(57) ABSTRACT

In a multi-echo measurement sequence with the goal of optimizing the spatial resolution given predetermined time difference between successive gradient echoes, gradient pulse parameters are set depending on a defined ratio between a predetermined time difference between echo times and a quotient of a predetermined maximum gradient pulse amplitude and a predetermined maximum gradient pulse rate-of-change.

13 Claims, 5 Drawing Sheets

(56) References Cited

OTHER PUBLICATIONS

Hwang et al., "Ramp sampling strageties for high resolution single-pass Dixon imaging at 3T" ISMRM (2006) p. 2462.
Larson et al., "Anisotropic Field-of-Views for PROPELLER MRI," Proc. Intl. Soc. Mag. Reson. Med., vol. 15, p. 1726 (2007).
Reeder et al., "Quantitative Assessment of Liver Fat with Magnetic Resonance Imaging and Spectroscopy," Journal of Magnetic Resonance Imaging, vol. 34, pp. 729-749 (2011).
Chen et al., "Correction for EPI Distortions Using Multi-Echo Gradient-Echo Imaging," Magnetic Resonance in Medicine, vol. 41, pp. 1206-1213 (1999).

\* cited by examiner

FIG 4

| | G | RT | FT | GFB | RTFB | FTFB |
|---|---|---|---|---|---|---|
| Regimen 1<br>(B) $\frac{2}{9}\Delta TE \le \frac{G_{max}}{S_{max}}$ | $G = \frac{1}{9} S_{max} \Delta TE$ | $\frac{G}{S_{max}} = \frac{1}{9}\Delta TE$ | $\frac{3}{9}\Delta TE$ | $-\frac{2}{9} S_{max} \Delta TE$ | $\frac{G_{FB}}{S_{max}} = \frac{2}{9}\Delta TE$ | 0 |
| Regimen 2<br>(A) $\frac{1}{12}\Delta TE < \frac{G_{max}}{S_{max}}$<br>(B) $\frac{G_{max}}{S_{max}} < \frac{2}{9}\Delta TE$ | $G = \frac{G_{max}}{2}(x+1)$<br>where x solves:<br>$(x+2)(x+3)^2 = \frac{S_{max}\Delta TE}{4 G_{max}}$ | $\frac{G}{S_{max}} = \frac{G_{max}(x+1)}{2 S_{max}}$ | $\frac{G_{max}\Delta TE}{G+G_{max}} - \frac{G+G_{max}}{S_{max}}$ | $-G_{max}$ | $\frac{G_{max}}{S_{max}}$ | $\frac{G_{max}\Delta TE}{G+G_{max}} - 3\frac{G+G_{max}}{S_{max}}$ |
| Regimen 3<br>(A) $\frac{1}{12}\Delta TE \ge \frac{G_{max}}{S_{max}}$ | $G = G_{max}$ | $\frac{G_{max}}{S_{max}}$ | $\frac{\Delta TE}{2} - \frac{2 G_{max}}{S_{max}}$ | $-G_{max}$ | $\frac{G_{max}}{S_{max}}$ | $\frac{\Delta TE}{2} - \frac{2 G_{max}}{S_{max}}$ |

603 → G  601 → RT  602 → FT  613 → GFB  611 → RTFB  613 → FTFB

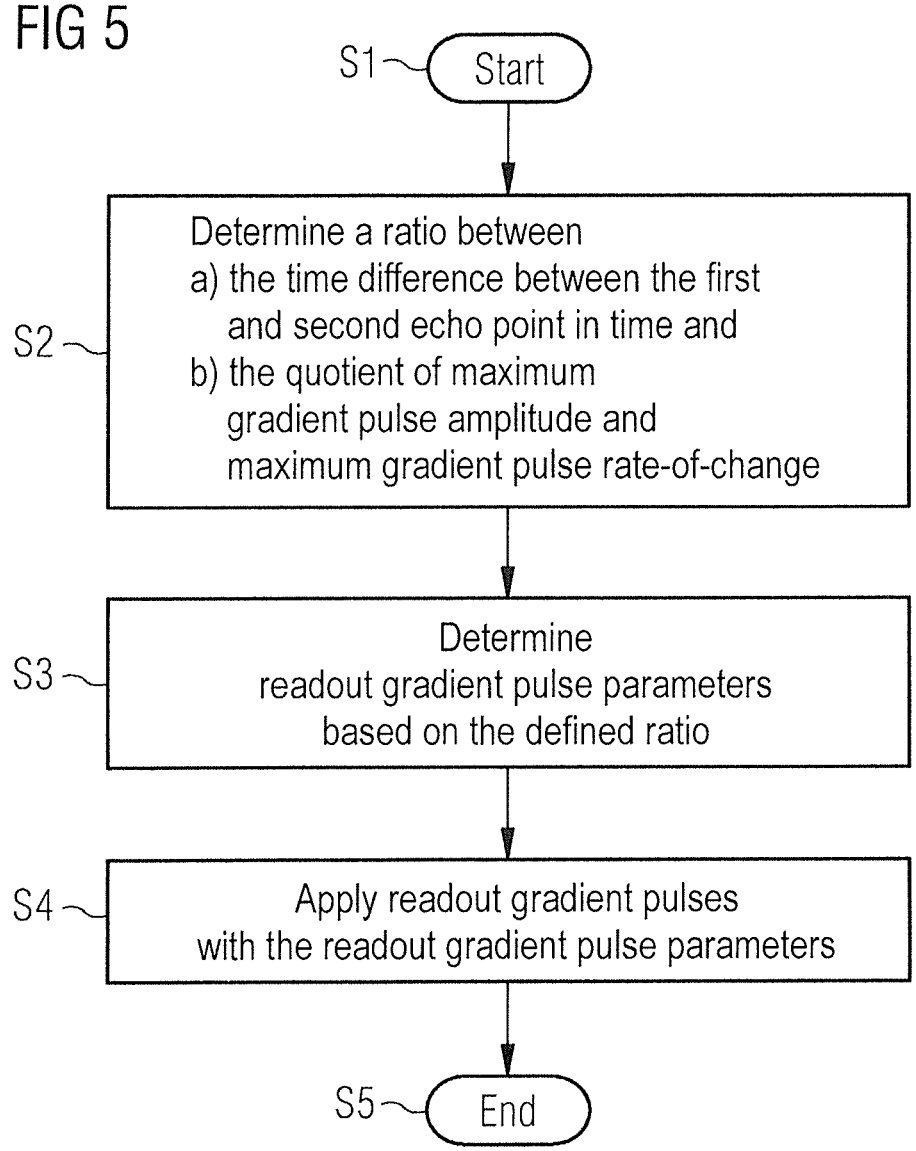

METHOD AND MAGNETIC RESONANCE SYSTEM TO IMPLEMENT A MULTI-ECHO MEASUREMENT SEQUENCE

BACKGROUND OF THE INVENTION

Field of the Invention

The present invention concerns a method to implement a multi-echo magnetic resonance (MR) measurement sequence and an MR system to execute such a method. In particular the invention concerns techniques that enable an increased spatial resolution given predetermined time difference between successive gradient echoes, in which a predetermined maximum gradient pulse amplitude and a predetermined maximum gradient pulse rate-of-change are not exceeded.

Description of the Prior Art

Multi-echo measurement sequences of magnetic resonance (MR) imaging are known in which multiple MR images with different echo times are respectively acquired from different anatomical slices of an examined person. Due to the different echo times, the multiple MR images typically have different contrasts. The MR images with different contrasts can be used in what are known as chemical shift techniques in which a separation of different spin species occurs.

Multi-echo measurement sequences are frequently implemented such that MR images are obtained at very specific and well-defined echo times. For example, the concrete selection of the echo times can depend on the desired application of the MR images. One example of a typical application would be fat/water separation. The sought echo times are typically dependent on the strength of the basic magnetic field (field strength-dependent). The echo time (TE1) of a first MR image and the time interval or the time difference between the echo times of successively acquired MR images ($\delta$TE) decreases in an inverse proportion to the strength of the basic magnetic field of the MR system. Typical basic magnetic field strengths are 1.5 Tesla, 3 Tesla, 5 Tesla or 7 Tesla, for example.

Various types of multi-echo measurement sequences are known. In a conventional multi-echo measurement sequence, all detected MR echoes are detected (meaning at the various echo times) respectively as a time period after a radiation of radio-frequency (RF) pulse for excitation of the transverse magnetization of nuclear spins of a subject (RF excitation pulse). In other words: a number n of MR echoes is respectively detected in each of separated repetition intervals (TR intervals) after an RF excitation pulse. Therefore, such techniques are also known to those skilled in the art as an n-echo n-TR approach. N-echo n-TR techniques are known in connection with the detection of gradient echoes, for example.

The resolution of an MR image in the readout direction (frequency coding direction) is typically defined by the Fourier pixel size $\Delta x$. The Fourier pixel size is the size of a field of view in the readout direction, divided by the number of readout points Nx. The field of view designates a region of an examination subject that is depicted by the MR image. The smaller the Fourier pixel size $\Delta x$, the higher the resolution. The Fourier pixel size is inversely proportional to the 0th moment of the readout gradient:

$$\Delta x = 2\pi/(\gamma M0x).$$

$\gamma$ is the gyromagnetic ratio. For water protons, the gyromagnetic ratio is $\gamma/(2\pi)$=42.576 MHz/T. The 0th moment of the readout gradient is the time integral of the amplitude of the readout gradient during the readout time, frequently also designated as an "area" of the readout gradient. If the readout gradient is thus constant during the entire readout time, the 0th moment M0x is then the product of amplitude of the readout gradient and readout time.

In gradient echo imaging, a switch is frequently made between the excitation and readout gradients of a pre-phasing gradient pulse in the readout direction whose 0th moment has the same magnitude as the moment of the readout gradient between the beginning of the readout gradient and the echo point in time. The direction of the pre-phasing gradient pulse is typically opposite the direction of the readout gradient, such that the total moment disappears exactly at the echo point in time. The echo time is often the time between the center of the excitation pulse and the echo point in time. For example, the echo time can be the time between a spin echo and the echo point in time.

Since the maximum amplitude of a gradient pulse and the shortest rise time can typically be technologically and/or physiologically limited, the maximum resolution with gradient echo-based n-echo n-TR techniques is thus conventionally limited by the shortest required gradient echo time TE1, but is not additionally limited by the shortest time difference $\Delta$TE of successive gradient echoes. However, the total duration that is required to implement the multi-echo MR measurement sequence (measurement duration) is comparably long. Moreover, such a technique frequently extends the time interval between the detection of the different gradient echoes. This can lead to negative effects, particularly in measurements that are implemented to avoid breathing artifacts while an examined person holds his breath. Moreover, time-dependent drifts of the basic magnetic field, such as due to physiological processes or heating during the measurement—can lead to additional phase differences between the individual MR images with different echo points in time. A subsequent evaluation of the MR images then can be possible only to a limited extent, and possible quantitative analyses can be plagued with a relatively large error.

Multi-echo measurement sequences are known other than the n-echo n-TR-based measurement sequence described above. For example, multi-echo measurement sequences are also known that detect multiple echoes at different echo points in time or echo times after a single RF excitation pulse. The detection of multiple echoes following one RF pulse is also called an n-echo per TR technique. n-echo per TR techniques have the advantage of a reduced measurement duration. Due to the predetermined different echo points in time, given such multi-echo measurement sequences a maximum achievable spatial resolution is typically limited by the first echo time TE1, and additionally by the time difference between successive echoes. It is of particular significance that the time period provided for the detection of an echo is also limited, because the next echo should already be formed and detected after the time period $\Delta$TE.

The maximum gradient amplitude and/or a maximum rise time and fall time of gradient fields or, respectively, rate-of-change of an MR system is often technologically and/or physiologically limited. For example, for the detection of gradient echoes it is often necessary to initially switch pre-phasing gradient pulses and to subsequently switch readout gradient fields during the readout of the gradient echo. Since the time period available for this is typically limited by the predetermined different echo points in time or the time difference between successive echo points in time, the maximum 0th moment M0x of the readout gradients (and therefore the achievable spatial resolution) is often limited accordingly.

SUMMARY OF THE INVENTION

Therefore, there is a need for improved multi-echo measurement sequences. In particular, a need exists for techniques which provide a high spatial resolution of the acquired MR images given a predetermined time difference between successive gradient echoes. A need additionally exists for such techniques which do not exceed predetermined maximum gradient pulse amplitudes and maximum gradient pulse rates-of-change, and have an optimally short measurement duration.

An object of the invention is to provide a method and MR apparatus to implement a multi-echo MR acquisition sequence, wherein those needs are satisfied.

According to the invention, in a method to implement a multi-echo measurement sequence with increased spatial resolution, at least two gradient echoes are formed sequentially with a predetermined time difference between successive gradient echoes. In this multi-echo measurement sequence, a predetermined maximum gradient pulse amplitude and a predetermined maximum gradient pulse rate-of-change are not exceeded. The method includes the determination of a ratio between the predetermined time difference and a quotient of the predetermined maximum gradient pulse amplitude and the predetermined maximum gradient pulse rate-of-change. Furthermore, the method includes application of a pre-phasing gradient pulse. Furthermore, the method includes application of a first readout gradient pulse with first readout gradient pulse parameters that include a flattop time and an amplitude. The readout gradient pulse parameters are selected depending on the determined ratio. Furthermore, the method includes the application of a second readout gradient pulse with second readout gradient pulse parameters that include a flattop time and an amplitude. The second readout gradient pulse parameters are selected depending on the determined ratio.

The readout gradient pulses are typically trapezoidal. The flattop time typically designates the flattop of the gradient pulse, i.e. that region in which a change of the gradient pulse amplitude is slight or zero. This region can also be designated as a plateau of the gradient pulse.

In the readout direction, the pre-phasing gradient pulse can be selected such that it compensates as exactly as possible for the moment acquired by the first readout gradient pulse at the desired echo point in time of the first gradient echo.

MR data are typically acquired only during the flattop time. Since the read-out MR signal or the acquired data is/are normally digitized with a constant sampling time (which here designates the time between successive readout points in time), in such a case a linear correlation exists between the kx coordinate (kx direction in k-space) and the readout time of a readout point. The read-out MR signal therefore can often be transformed directly, i.e. without additional interpolation (known as regridding), from k-space into image space (image domain) or hybrid space with a fast Fourier transformation. With the use of the known technique called ramp sampling, MR data are additionally acquired during the ramps of the readout gradient pulses. In order to achieve the same resolution with and without ramp sampling, the same path (trajectory) along which the acquired data are entered into k-space should typically be traversed during the readout time. If MR data are acquired during the complete ramp time of the readout gradient pulse, for example, it can be worthwhile to choose the 0th moment of the complete readout gradient pulse to be equal to the 0th moment of the flattop alone, without ramp sampling. For a given technical capability of the gradient system, with ramp sampling a desired resolution can then be achieved in a shorter time than in embodiments without ramp sampling. A higher resolution can accordingly be achieved for a given time difference.

Ramp sampling is known to those skilled in the art in relation to dual echo 3D gradient echo sequence, for example from "Ramp sampling strategies for high resolution single-pass Dixon imaging at 3T" in Proc. Int. Soc. Reson. Med. 15 (2010) 1044.

An increased resolution in the readout direction can be achieved by the use of ramp sampling. However, the principle problem remains that the resolution in the readout direction is limited by the time difference between successive echo times.

The time difference between successive echoes is typically predetermined by the echo times. The echo times are typically predetermined in turn by the desired application of the MR imaging, for example fat/water separation. The maximum gradient pulse amplitude is thereby normally a characteristic number of a gradient system of a corresponding MR system and can be technically limited, for example. The predetermined maximum gradient pulse rate-of-change is often chosen to be smaller than the technically maximum possible rate-of-change of the gradient system in order to avoid peripheral nerve stimulations of an examined person.

The ratio between the predetermined time difference and a quotient of the predetermined maximum gradient pulse amplitude and the predetermined maximum gradient pulse rate-of-change can initially be determined. By determining the ratio, it can be possible to respectively select a gradient shape of the gradient pulses such that the resolution in the readout direction is advantageously maximized under the given boundary conditions. The 0th moment of the readout gradient during the readout time is directly proportional to the path traversed in k-space.

The ratio can be characteristic of regimens in which the gradient shape maximizes the area under the flattop of the readout gradient under different boundary conditions, and thereby achieves a maximum resolution. Due to the predetermined time difference and the finite gradient pulse rate-of-change, the maximum area is achieved not necessarily at the maximum gradient amplitude but rather also at other values, depending on the determined ratio.

Such considerations can in principle be applied in the most varied multi-echo measurement sequences, for instance given bipolar multi-echo measurement sequences in which successive readout gradient pulses have the inverse polarity as the gradient pulse amplitude.

In a sequence known as a monopolar multi-echo measurement sequence, successive readout gradients have the same polarity. Between the first and second readout gradient pulse, the method can furthermore include: application of a flyback gradient pulse with flyback gradient pulse parameters that include a flyback flattop time and a flyback amplitude. The flyback gradient pulse parameters can be chosen depending on the determined ratio.

The flyback gradient pulse can thus suitably manipulate the phase of the transversal magnetization so that one of the gradient echoes is formed during the application of the second readout gradient pulse. The flyback gradient pulse can thus have the task of optimally exactly compensate the phase that the spins acquire after the first gradient echo and before the second gradient echo as a result of the two readout gradient pulses. The flyback gradient pulse thus typically has the same polarity as the pre-phasing gradient pulse and the inverse polarity as the two readout gradient pulses.

The use of a bipolar readout scheme is typically more time-efficient than the use of a monopolar readout scheme. However, the monopolar readout scheme can have other advantages. For example, spin species with different resonance frequencies are shifted in the same direction in successive contrasts. In contrast to this, in the bipolar readout scheme the shift occurs in direction opposite to one another, which can provide difficulties in post-processing methods such as Dixon.

It is possible to select the first readout gradient pulse parameters to be the same as the second readout gradient pulse parameters. The amplitudes and the flattop times or, respectively, the readout intervals can thus be of equal size or, respectively, equal length. It would also be possible that the first readout gradient pulse is symmetrical relative to the first gradient echo, and that the second readout gradient pulse is symmetrical relative to the second gradient echo.

In other words, the gradient shape of the first and second readout gradient pulses can thus be comparable. This can enable a particularly simple multi-echo measurement sequence that is also comparably efficient.

If, in the defined ratio, the quotient is smaller than a predefined fraction A of the time difference, the amplitude and flyback amplitude can be chosen identical to the maximum gradient pulse amplitude. For example, the fraction A can be $1/12$ in different embodiments.

A regimen of the defined ratio can thus be defined such that it is characterized in that both the amplitude of the readout gradient pulse and the flyback amplitude are chosen identical to the maximum gradient pulse amplitude.

If, in the defined ratio, the quotient is greater than a predefined fraction B of the time difference, the amplitude and flyback amplitude can be chosen to be smaller than the maximum gradient pulse amplitude.

For example, the fraction B can be $2/9$. The amplitude can be chosen identical to a factor C of the product of maximum change rate and time difference. The flyback amplitude can be chosen to be twice as large as the amplitude. For example, the factor C can be $1/6$.

An additional regimen of the defined ratio can be to set both the amplitude of the readout gradient pulse and the flyback amplitude are chosen to be smaller than the maximum gradient pulse amplitude.

If, in the defined ratio, the quotient is smaller than a predefined fraction B and greater than the fraction A, the amplitude can be chosen smaller than the maximum gradient pulse amplitude and the flyback amplitude can be chosen to be equal to the maximum gradient pulse amplitude. For example, the amplitude can be chosen to be equal to a fraction E of the maximum gradient pulse amplitude, wherein $E=(x+1)/2$, wherein x is a solution to the equation $(x+2)(x+3)^2=4(S_{max}\Delta TE/G_{max})$, wherein $S_{max}$ is the maximum gradient pulse rate-of-change and $G_{max}$ is the maximum gradient pulse amplitude.

An additional regimen of the defined ratio can be to set the amplitude of the readout gradient pulse is chosen to be smaller than the maximum amplitude while the flyback amplitude is chosen to be equal to the maximum gradient pulse amplitude.

It is possible to choose ramp times of the first and/or second gradient pulse to be minimal under consideration of the maximum gradient pulse rate-of-change. A particularly high spatial resolution can be achieved in such a manner.

According to the preceding techniques, the amplitudes of the gradient pulses are respectively selected depending on the defined ratio so that the resolution of the obtained MR images is maximum under the predetermined boundary conditions of the time difference and maximum gradient pulse amplitude, as well as maximum gradient pulse rate-of-change. These techniques are based on the realization that it is not necessarily optimal, with regard to a maximized resolution, to choose the amplitude, namely the flyback amplitude, to be maximal. Depending on specific multi-echo measurement sequences, different regimen limits result: however, the fundamental dependency on the defined ratio typically remains.

The invention does encompass a magnetic resonance system that is designed to implement a multi-echo measurement sequence with increased spatial resolution in which at least two gradient echoes are formed sequentially with a predetermined time difference between successive gradient echoes, and in which a predetermined maximum gradient pulse amplitude and a predetermined gradient pulse rate-of-change are not exceeded. The magnetic resonance system has a computer that is configured to determine a ratio between a) the predetermined time difference and b) a quotient of the predetermined maximum gradient pulse amplitude and the predetermined maximum gradient pulse rate-of-change. The magnetic resonance system furthermore has a gradient system that is operated to activate a pre-phasing gradient pulse, and activate a first readout gradient pulse with first readout gradient pulse parameters that include a flattop time and an amplitude, with the readout gradient pulse parameters being set depending on the defined ratio. The gradient system is furthermore operated to activate a second readout gradient pulse with second readout gradient pulse parameters that include a flattop time and an amplitude, with the second readout gradient pulse parameters being set depending on the defined ratio.

The MR system is furthermore designed to implement a multi-echo measurement sequence according to all embodiments of the inventive method described above.

For such an MR system, advantages are achieved that are comparable to those achieved for the method to implement a multi-echo measurement sequence according to the present invention.

The features presented above and features that are described in the following can be used not only in the corresponding, explicitly presented combination, but also in additional combination or isolation, without departing from the scope of the present invention.

BRIEF DESCRIPTION OF THE DRAWINGS

FIG. 4 shows optimized values of the gradient pulse parameters for the different regimens from FIG. 3.

FIG. 5 is a flowchart of a method to implement a multi-echo measurement sequence according to different embodiments.

DESCRIPTION OF THE PREFERRED EMBODIMENTS

Figure 1:
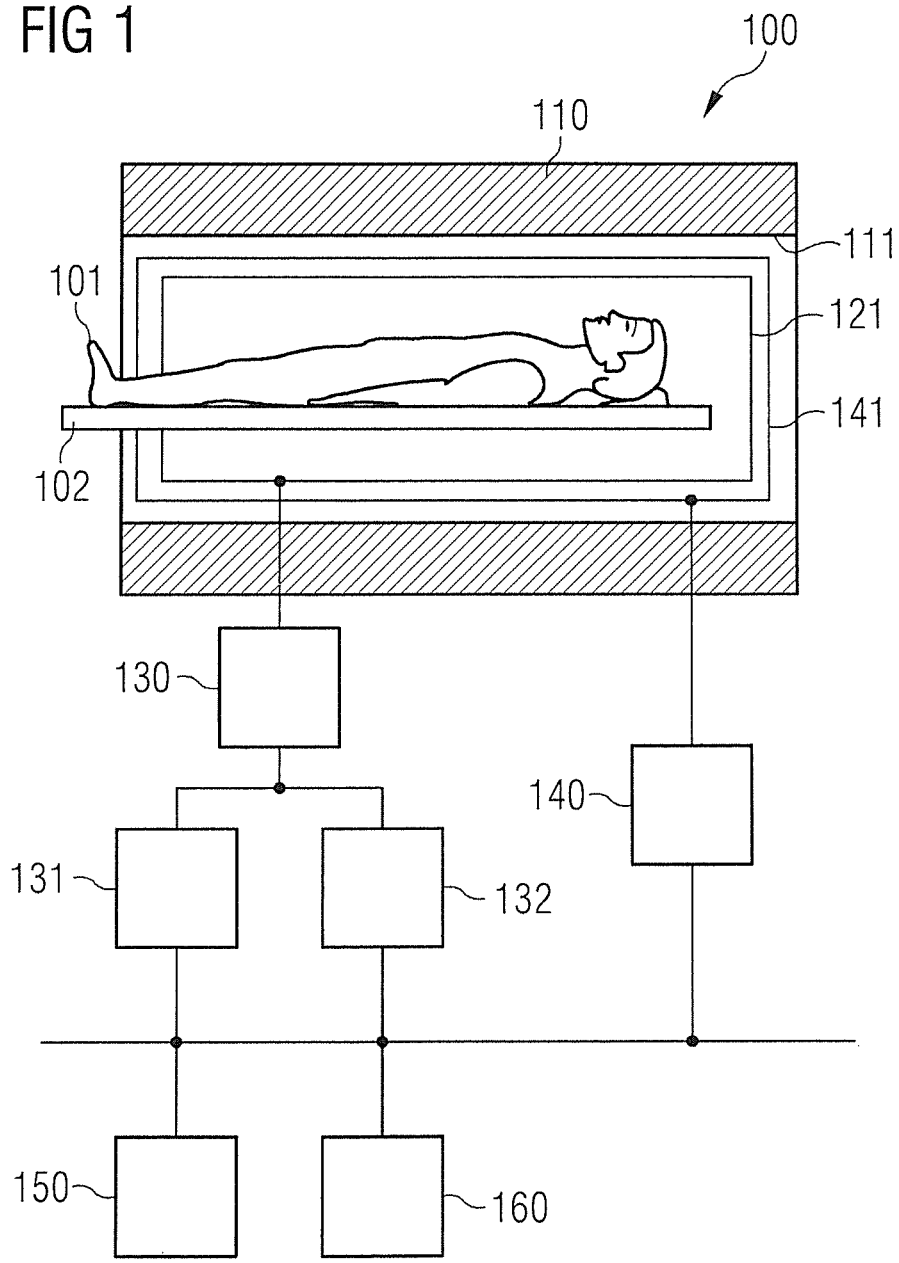
FIG. 1 schematically illustrates an MR system.

In the following, the present invention is explained in detail using preferred embodiments with reference to the figures, wherein identical reference characters denote identical or similar elements.

In FIG. 1, an MR system 100 is shown that is designed to implement techniques, methods and steps according to the invention. The MR system 100 has a magnet 110 that defines a tube 111. The magnet 110 can generate a basic magnetic field parallel to its longitudinal axis. An examination subject (here an examined person 101) on a bed table 102 can be slid into the magnet 110. The MR system 100 furthermore has a gradient system 140 to generate gradient fields that are used for MR imaging and for spatial coding of acquired MR data. The gradient system 140 typically has at least three gradient coils 141 that can be controlled separately and positioned in a well-defined manner relative to one another. The gradient coils 141 enable gradient fields to be applied and switched along defined spatial directions (gradient axes). The corresponding gradient coils 141 are also designated as channels of the gradient system 140. A machine coordinate system of the MR system 100 can be defined by the windings of the gradient coils 141. The gradient fields can be used for slice selection, for frequency coding (in the readout direction) and for phase coding, for example. Spatial coding of the raw data can thereby be achieved. The spatial directions (which are respectively parallel to slice selection gradient fields, phase coding gradient fields and readout gradient fields) do not necessarily need to be coincident with the machine coordinate system. Rather, they can be defined, for example, in relation to a k-space trajectory which can in turn be established on the basis of specific requirements of the respective MR measurement sequence and/or be established based on anatomical properties of the examined person 101.

An RF coil arrangement 121 radiates an amplitude-modulated RF excitation pulse into the examined person 101, so as to deflect nuclear spins in the person 101 from the polarization thereof produced by the basic magnetic field (alignment of the magnetization in the longitudinal direction). A transverse magnetization of the spins is thereby produced. To generate such RF excitation pulses, an RF transmission unit 131 is connected via an RF switch 130 with the RF coil arrangement 121. The RF transmission unit 131 can include an RF generator and an RF amplitude modulation unit. The RF excitation pulses can flip the transversal magnetization slice-selectively in 1d or spatially selectively in 2D/3D, or globally, out of the steady state.

Furthermore, an RF reception unit 132 is coupled via the RF switch 130 with the RF coil arrangement 121. MR signals of the relaxing transversal magnetization can be acquired via the RF reception unit 132 as raw data, for example via inductive injection into the RF coil arrangement 121.

In general, it is possible to use separate RF coil arrangements 121 for the radiation of the RF excitation pulses by means of the RF transmission unit 131 and for the acquisition of MR data by means of the RF reception unit 132. For example, a volume coil 121 can be used for the radiation of RF pulses and a surface coil (not drawn) which comprises an array of RF coils can be used for the acquisition of MR data. For example, the surface coil for the acquisition of MR data can include 32 individual RF coils and therefore is particularly suitable for partially parallel imaging (ppa imaging, partially parallel acquisition). Such techniques are known to those skilled in the art, and thus need not be explained in detail herein. The MR system 100 furthermore has a computer 160. The computer 160 is configured in order to control the acquisition of MR data within the scope of a multi-echo measurement sequence.

Figure 2:
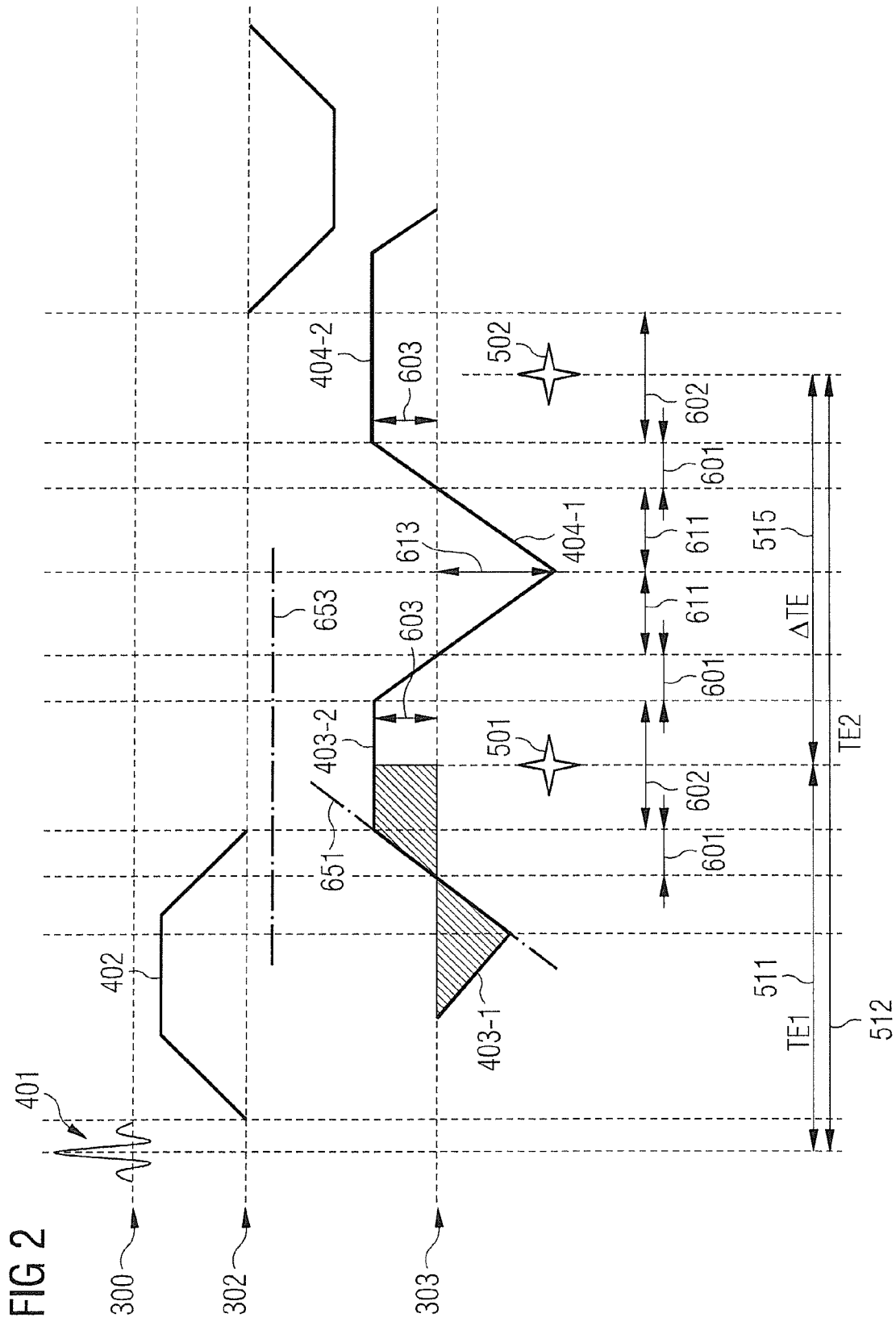
FIG. 2 shows a multi-echo measurement sequence according to different embodiments of the invention.

A sequence scheme of a multi-echo measurement sequence according to different embodiments is depicted in FIG. 2. The radio-frequency signal 300 is depicted at the top in FIG. 2. Radiation of an RF pulse 401-1 initially takes place. For clarity, the application of a slice selection gradient field is not shown in FIG. 2. The RF pulse 401-1 excites transverse magnetization (RF excitation pulse), i.e. deflects the longitudinal magnetization of the nuclear spins at least partially out of a steady state.

The application of a phase coding gradient field 402 along the phase coding direction 302 subsequently takes place. In FIG. 2, a k-space line is scanned twice (double echo gradient echo sequence). For this, a pre-phasing gradient pulse 403-1 is initially switched along the readout direction 303. The goal of the pre-phasing gradient 403-1 ("readout prephasing gradient") is to compensate as precisely as possible for the phase that the spins acquire as a result of a readout gradient 403-2 at the desired first echo point in time 501 (corresponding to first echo time TE1, 511) of the first gradient echo (this is illustrated in FIG. 2 by the identically sized dashed areas under the gradient pulses 403-1, 403-2). The first readout gradient pulse 403-2 is subsequently switched for frequency-coding of the transversal magnetization. The second readout gradient pulse 404-2 forms the second gradient echo at the second echo point in time 502 (corresponding to the second echo time TE2, 512). Since both readout gradient pulses 403-2, 404-2 have the same polarity (monopolar readout scheme) in the shown example, a flyback gradient pulse 404-1 is switched between the readout gradients 403-2, 404-2, the moment of which flyback gradient pulse 404-1 is chosen such that it compensates the phase which the spins acquire as a result of the first readout gradient 403-2 after the first echo time TE1 and before the second echo time TE2 as a result of the second readout gradient 404-2.

A gradient echo always forms at those times t at which it applies for the entire accumulated zeroth gradient moment that:

$$m_i(t) = \int_{t_0}^{t} G_i(\tilde{t}) d\tilde{t} = 0; i = R, S,$$

wherein R, S respectively designate the readout direction 303 and the slice selection direction 301. The start of integration $t_0$ is what is known as the isodelay point in time of the RF pulse 401, which coincides in good approximation with the temporal middle of the RF pulse 401 given symmetrical, sinc-shaped RF pulses.

The time difference TE, 515 between the two echo points in time 501, 502 limits the resolution. Without ramp sampling, the resolution is provided by the area under the flattop of the readout gradient pulses 403-2, 404-2. This area is provided by the flattop time 602 (readout interval) and the amplitude 603. The ramp time 601 is downwardly limited by the maximum gradient pulse rate-of-change.

In the example of FIG. 2, the echo time $TE_1$ of the first contrast is identical to the time difference $\Delta TE = TE_2 - TE_1$ between the two echo times $TE_2$ and $TE_1$. For example, this is the case given the previously described 2-point Dixon technique and given opposed-phase/in-phase imaging, for example.

The readout gradient pulses 403-2, 404-2 are trapezoidal. From FIG. 2, it is clear that here the ramp time 601 is chosen to be minimal under consideration of the maximum gradient pulse rate-of-change 651. Furthermore, from FIG. 2 it is clear that the amplitude 603 is chosen to be smaller than the maximum gradient pulse amplitude 653. This is based on the realization that the maximum resolution is not necessarily achieved at maximum amplitude 603. This is the case since a finite time for reaching the amplitude 603 is also to be applied due to the finite maximum gradient pulse rate-of-change 651.

Furthermore, from FIG. 2 it can be seen that the flyback gradient pulse 404-1 is triangular, meaning that its flattop time is chosen equal to zero. The ramp times 611 are in turn chosen to be as short as possible under consideration of the maximum gradient pulse rate-of-change 651. The flyback amplitude 613 of the flyback gradient pulse 404-1 is also chosen to be smaller than the maximum gradient pulse amplitude 653.

Figure 3:
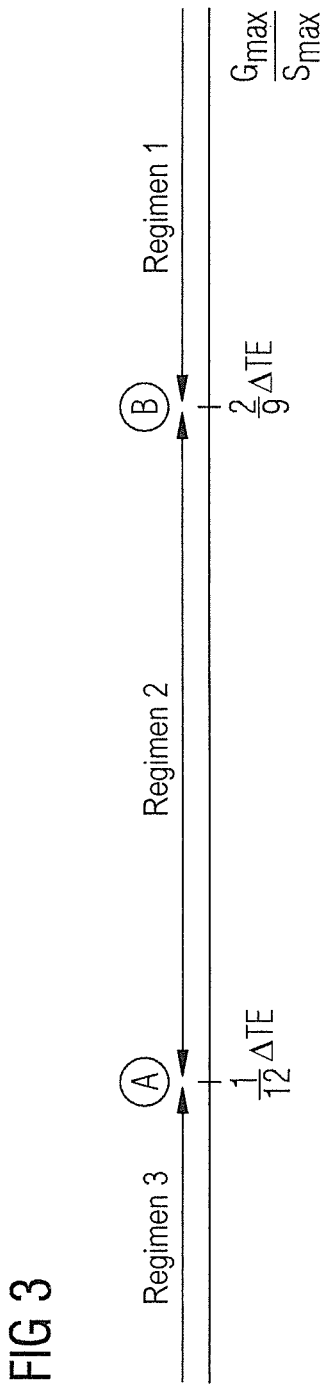
FIG. 3 illustrates regimens with regard to which gradient pulse parameters are chosen in the multi-echo measurement sequence of FIG. 2.

The specific selection of the gradient pulse parameters of the readout gradient pulses 403-2, 404-2 or of the flyback gradient pulse 404-1 takes place depending on the ratio between the quotient of the predetermined maximum gradient pulse amplitude 653, (Gmax) to the maximum gradient pulse rate-of-change 651, (Smax) and the time difference 515 ($\Delta$TE). Three regimens can be defined depending on different parameters of the multi-echo measurement sequence, for example (see FIG. 3). The gradient pulse parameters can be chosen differently depending on in which regimen the concrete multi-echo measurement sequence is set up.

This is explained in the following for the multi-echo measurement sequence of the embodiment of FIG. 2. The gradient shape is sought that maximizes the resolution in the readout direction under consideration of the time difference 515; TE, as well as the boundary conditions of the maximum gradient pulse parameters 651, 653. The 0th moment of the readout gradient pulses 403-2, 404-2 during the flattop time or, respectively, the readout interval 602 is directly proportional to the path traversed in k-space. Without ramp sampling and under defined symmetry assumptions (identical amplitudes 603 of the readout gradient pulses 403-2, 404-2, as well as the shortest possible ramp time 601, as well as symmetry of the readout gradient pulses 403-2, 404-2 at the echo points in time 501, 502), that maximum resolution is thus achieved with the gradient shape that maximizes the area under the flattop of the readout gradient pulses 403-1, 404-2. Due to the predetermined time difference 515; $\Delta$TE and the finite ramp time 601, the maximum area is not necessarily achieved at maximum amplitude 603.

The following results are achieved by means of a calculation which supplies the maximum area under the flattop of the readout gradient pulses 403-1, 404-2 (for example by formulating the area as a function depending on the different parameters and a subsequent extreme value finding). For a first regimen that is provided by $(2/9)\Delta TE \leq (Gmax/Smax)$ (see FIG. 3), maximum resolution is achieved with the amplitude 603; G, which is selected as $(1/9)Smax\Delta TE$. The ramp time 601; RT of the readout gradient pulses 403-2, 404-2 is set to $RT=(1/9)\Delta TE$; the flattop time 602; FT is chosen to be $FT=(3/9)\Delta TE$. The flyback gradient pulse 404-1 is triangular with a ramp time 611; $RT_{FB}=(2/9)\Delta TE$ and an amplitude 613; $G_{FB}=-2G=-(2/9)Smax\Delta TE$. See also in this regard FIG. 4, topmost line.

For a second regimen that is provided by $(1/12)\Delta TE \leq (Gmax/Smax)<(2/9)\Delta TE$ (see FIG. 3), maximum resolution is achieved with the amplitude 603, G, which is between Gmax/2 and Gmax. The exact value of the amplitude 603, G is achieved by solving $(x+2)(x+3)^2=4(Smax\Delta TE)/Gmax$ in the range $0<x<1$. A unique solution of the cubic equation exists in this range, which solution can be found numerically or graphically, for example. The sought amplitude 603; G is obtained from x with $G=(Gmax/2)(x+1)$, and from this the sought ramp time 601; RT=G/Smax is obtained in turn. The flattop time 602; FT of the readout gradient pulses 403-2, 404-2 is obtained by inserting the previously calculated values into the following formula:

$$FT=(Gmax\Delta TE)/(G+Gmax)-(G+Gmax)/Smax.$$

In this regimen, the flyback gradient pulse 404-1 is trapezoidal with maximum flyback amplitude 613; $G_{FB}=-Gmax$ and minimum ramp time 611; $RT_{FB}=Gmax/Smax$. The flattop time $FT_{FB}$ of the flyback gradient pulse 404-1 is obtained with the aid of the previously calculated amplitude 603, G as $$FT_{FB}=(G\Delta TE)/(G+Gmax)-3(G+Gmax)/Smax.$$

See also in this regard FIG. 4, middle line.

Maximum resolution is achieved with maximum amplitude 603 for a third regimen (see FIG. 3), which is provided by $(1/12) \Delta TE \geq (Gmax/Smax)$. The flyback gradient pulse 404-1 is again trapezoidal with maximum flyback amplitude 613. Due to the symmetry of the problem, an analytical solution can be specified in this range:

$$G=Gmax;\ G_{FB}=-Gmax;\ RT=RT_{FB}=Gmax/Smax;$$

$$FT=FT_{FB}=\Delta TE/2-2Gmax/Smax.$$

Since the first gradient echo at the first echo point in time 501 in the example should be centered in the middle of the flattop time 602 of the first readout gradient pulse 403-2, the 0th moment of the pre-phasing gradient pulse 403-1 is chosen to be equal to half of the 0th moment of the first readout gradient pulse 403-2 (see dashed area in FIG. 2).

In the first regimen—i.e. $(2/9)\Delta TE \leq (Gmax/Smax)$—the 0th moment of the pre-phasing gradient pulse 403-1 is $A_{GRP}=G*(FT+RT)/2=(2/81)Smax\ \Delta TE2$, for example. Most efficient in the first regimen is a triangular pre-phasing gradient pulse 403-1 with a ramp time $RT_{GRP}=(A_{GRP}/Smax)$ $1/2=(\sqrt{2/9})\Delta TE$ and maximum amplitude $G_{GRP}=-(\sqrt{2/9})Smax\Delta TE$. The pre-phasing gradient pulse 403-1 can be switched between the end of the RF pulse 401 and the beginning of the first readout interval, which in the example coincides with the beginning of the flattop of the first readout gradient pulse 403-2. The available time is thus TE1−TS−$(3/18)\Delta TE$, wherein TS is the time between the isodelay point of the RF pulse 401 and the end of the RF pulse 401. In the example, the end of the RF pulse 401 should coincide with the end of the flattop of the slice selection gradient 402. This time TS is normally short relative to the first echo time 511; TE1. In various reference implementations, for example, it is between 40 μs and 80 μs. The time available for the pre-phasing Tavailable=TE1−TS−$(3/18)\Delta TE \geq 1.15$ ms−0.08 ms−$(3/18)1.15$ ms−0.89 is thus large relative to the time need for the pre-phasing Tneeded=$(\sqrt{2/9})\Delta TE=(\sqrt{2/9})1.15$ ms~0.18 ms. The same applies to the other regimen (see FIG. 4).

The slice rephasing gradient pulse (not shown in FIG. 2) and the phase coding table (phase coding gradient pulse 402 in FIG. 2) is also switched in the time interval between the end of the RF pulse 401 and the beginning of the first readout interval d602. These three gradients can thereby be switched temporally in parallel. In Cartesian imaging, the resolution in the phase coding direction is normally less than or equal to the resolution in the readout direction. Given an approximately quadratic image field ("field of view"), the absolute value of the maximum 0th moment of the phase coding gradient $A_{PE,max}=\pi(N_{PE}-1)/(\gamma FoV_{PE})$ normally does not (or does not significantly) exceed the absolute value of the maximum moment of the pre-phasing gradient pulse 403-1 $A_{GRP}\sim A_{GRO}/2=0.5*(2\pi N_{RO}/(\gamma FoV_{RO}))$. $N_{PE}$ is the number of phase coding steps, $N_{RO}$ is the number of scan points in the readout direction, $FoV_{PE}$ is the field of view in the phase coding direction, $FoV_{RO}$ is the field of view in the readout direction, and $\gamma/(2\pi)$ is the gyromagnetic ratio. The time required for the phase coding table consequently also does not exceed the time required for the readout pre-phasing. In the example, the time available between the end of the RF pulse 401 and the beginning of the first readout interval 602 cannot be used efficiently. This also applies for other practically relevant applications of the multi-echo sequence, due to the comparable predetermined echo times. The resolution in the readout direction 303 is thus limited by the time difference 515; ΔTE between first and second echo time 511, 512; TE1, TE2, and normally is not limited by the first echo time 511; TE1.

A flowchart of a method to implement a multi-echo measurement sequence is depicted in FIG. 5. The method begins in Step S1. In Step S2, the ratio between the time difference 515 on the one hand and the quotient of maximum gradient pulse amplitude 653 and gradient pulse rate-of-change 651 on the other hand is initially determined. The parameters of the readout gradient pulses 403-2, 404-2 are then selected in Step S3 depending on this ratio. The parameters of the flyback gradient pulse 404-1 are also optionally selected. For example, for this a classification in regimens can take place (see FIG. 3). The readout gradient pulses 403-2, 404-2 are applied in Step S4. The method ends in Step S5.

Naturally, the features of the embodiments and aspects of the invention that are described in the preceding can be combined with one another. In particular, the features can be used not only in the described combinations but also in other combinations or individually, without leaving the scope of the invention.

For example, it can be impossible due to engineering, or possible only to a limited extent, to arbitrarily select different values such as, for example, the gradient pulse amplitude or the rise time. Rather, it can be necessary to consider defined discretizations or gridding, for example due to analog/digital conversion or other technical limitations. Therefore, the actual values can fluctuate around the values discussed in the preceding, within such tolerance ranges. In other words: in real systems a resolution with which different values can be realized can be limited so that certain fluctuations can be inherently present.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire magnetic resonance (MR) data, comprising:
    from a control unit, operating an MR data acquisition unit to execute a multi-echo MR data acquisition sequence in which at least two gradient echoes are formed to sequentially occur, with a predetermined time difference between successive gradient echoes, and in which gradient pulses are activated that do not exceed a predetermined maximum pulse amplitude and a predetermined maximum gradient pulse rate-of-change;
    in said control unit, automatically determining a ratio between (a) said predetermined time difference and (b) a quotient of the predetermined maximum gradient pulse amplitude and the predetermined maximum gradient pulse rate-of-change;
    from said control unit, operating said MR data acquisition unit in said multi-echo MR data acquisition sequence to activate a pre-phasing gradient pulse;
    from said control unit, operating said MR data acquisition unit in said multi-echo MR data acquisition sequence to readout MR data associated with one of said at least two gradient echoes by activating a first readout gradient pulse having first readout gradient pulse parameters that include a flattop time and an amplitude, and setting said first readout gradient pulse parameters in said control unit dependent on the determined ratio;
    from said control unit, operating said MR data acquisition unit in said multi-echo MR data acquisition sequence to read out MR data associated with one of said at least two gradient echoes by activating a second readout gradient pulse having second readout gradient pulse parameters that include a flattop time and an amplitude, and setting said second readout gradient pulse parameters in said control unit dependent on the determined ratio; and
    entering the MR data read out with said first readout gradient pulse and said second readout gradient pulse into a memory organized as k-space and, via said control unit, making contents of said memory available in electronic form for further processing thereof.

2. A method as claimed in claim 1 comprising:
    from said control unit, operating said MR data acquisition unit to execute a monopolar gradient echo MR data acquisition sequence, as said multi-echo MR data acquisition sequence;
    from said control unit, operating said MR data acquisition unit in said monopolar gradient echo MR data acquisition sequence by activating a flyback gradient pulse between said first readout gradient pulse and said second readout gradient pulse, said flyback gradient pulse having flyback gradient pulse parameters that include a flyback flattop time and a flyback amplitude; and
    in said control unit, setting said flyback gradient pulse parameters dependent on the determined ratio.

3. A method as claimed in claim 2 comprising setting said first readout gradient pulse parameters to be the same as said second readout gradient pulse parameters.

4. A method as claimed in claim 3 comprising:
    when said quotient in said ratio is smaller than a predetermined fraction of said time difference, setting the amplitude of the first and second readout gradient pulses, and the flyback amplitude, equal to said maximum gradient pulse amplitude.

5. A method as claimed in claim 4 wherein said fraction is 1/12.

6. A method as claimed in claim 3 comprising:
    when said quotient in said ratio is greater than a predetermined fraction of said time difference, setting the amplitude of the first and second readout gradient pulses, and the flyback amplitude, to be smaller than said maximum gradient pulse amplitude.

7. A method as claimed in claim 6 wherein said fraction is 2/9 and comprising:
    setting said amplitude of the first and second readout gradient pulses equal to a fraction of the product of said maximum rate of change and said time difference; and
    setting said flyback amplitude to be twice as large as said amplitude of said first and second readout gradient pulses.

8. A method as claimed in claim 7 wherein said fraction of the product of said maximum rate-of-change and said time difference is 1/9.

9. A method as claimed in claim 3, comprising:
when said quotient in said ratio is greater than a first predetermined fraction of said time difference and is smaller than a second predetermined fraction of said time difference, setting the amplitude of the first and second readout gradient pulses to be smaller than said maximum gradient pulse amplitude, and setting the flyback amplitude to be equal to said maximum gradient pulse amplitude.

10. A method as claimed in claim 9 wherein said first predetermined fraction is 1/12 and second predetermined fraction is 2/9.

11. A method as claimed in claim 9 comprising:
setting said amplitude of said first and second readout gradient pulses to be a fraction E of said maximum gradient pulse amplitude, wherein E=(x+1)/2, and wherein x is a solution to $(x+2)(x+3)2=4(S_{max}\Delta TE/G_{max}$, wherein $\Delta TE$ is the predetermined time difference between successive gradient echoes, $S_{max}$ is the maximum gradient pulse rate-of-change, and $G_{max}$ is the maximum gradient pulse amplitude.

12. A method as claimed in claim 1 wherein said first readout gradient pulse parameters include a first readout gradient pulse ramp time and wherein said second readout gradient pulse parameters include a second readout gradient pulse ramp time, and comprising:
setting at least one of said first readout gradient pulse ramp time and said second readout gradient pulse ramp time as short as it is possible without exceeding said maximum gradient pulse rate-of-change.

13. A magnetic resonance apparatus comprising:
a magnetic resonance data acquisition unit;
a control unit configured to operate the MR data acquisition unit to execute a multi-echo MR data acquisition sequence in which at least two gradient echoes are formed to sequentially occur, with a predetermined time difference between successive gradient echoes, and in which gradient pulses are activated that do not exceed a predetermined maximum pulse amplitude and a predetermined maximum gradient pulse rate-of-change;
said control unit being configured to automatically determine a ratio between (a) said predetermined time difference and (b) a quotient of the predetermined maximum gradient pulse amplitude and the predetermined maximum gradient pulse rate-of-change;
said control unit being configured to operate said MR data acquisition unit in said multi-echo MR data acquisition sequence to activate a pre-phasing gradient pulse;
said control unit being configured to operate said MR data acquisition unit in said multi-echo MR data acquisition sequence to readout MR data associated with one of said at least two gradient echoes by activating a first readout gradient pulse having first readout gradient pulse parameters that include a flattop time and an amplitude, and setting said first readout gradient pulse parameters in said control unit dependent on the determined ratio;
said control unit being configured to operate said MR data acquisition unit in said multi-echo MR data acquisition sequence to read out MR data associated with one of said at least two gradient echoes by activating a second readout gradient pulse having second readout gradient pulse parameters that include a flattop time and an amplitude, and setting said second readout gradient pulse parameters in said control unit dependent on the determined ratio;
an electronic memory organized as k-space; and
said control unit being configured to enter the MR data read out with said first readout gradient pulse and said second readout gradient pulse into said memory and, via said control unit, to make contents of said memory available in electronic form for further processing thereof.

* * * * *